United States Patent
Kim et al.

(10) Patent No.: US 11,114,988 B2
(45) Date of Patent: Sep. 7, 2021

(54) DOHERTY AMPLIFIER CIRCUIT WITH INTEGRATED HARMONIC TERMINATION

(71) Applicant: Cree, Inc., Durham, NC (US)

(72) Inventors: Jangheon Kim, Chandler, AZ (US);
Sonoko Aristud, San Jose, CA (US);
Michael E. Watts, Scottsdale, AZ (US);
Mario Bokatius, Chandler, AZ (US)

(73) Assignee: Cree, Inc., Durham, NC (US)

( * ) Notice: Subject to any disclaimer, the term of this patent is extended or adjusted under 35 U.S.C. 154(b) by 55 days.

(21) Appl. No.: 16/421,999

(22) Filed: May 24, 2019

(65) Prior Publication Data

US 2020/0373892 A1    Nov. 26, 2020

(51) Int. Cl.
*H03F 3/68* (2006.01)
*H03F 3/24* (2006.01)
(Continued)

(52) U.S. Cl.
CPC .......... *H03F 3/245* (2013.01); *H03F 1/0288* (2013.01); *H03F 1/56* (2013.01);
(Continued)

(58) Field of Classification Search
CPC ............. H03F 1/0288; H03F 1/56; H03F 3/68
(Continued)

(56) References Cited

U.S. PATENT DOCUMENTS 2,881,379 A * 4/1959 Logan, Jr. ............. H02P 27/026
  318/812
6,028,485 A * 2/2000 Sigmon ................ H03F 1/0277
  330/286
(Continued)

FOREIGN PATENT DOCUMENTS

EP   3160042 A1    4/2017
WO   2013188994 A1  12/2013
WO   2019075694 A1   4/2019

OTHER PUBLICATIONS

Doherty, W., "A New High Efficiency Power Amplifier for Modulated Waves", Technical papers, Sep. 1, 1936, pp. 1-20, vol. 24, No. 9, Proceedings of the Institute of Radio Engineers.
(Continued)

*Primary Examiner* — Steven J Mottola
(74) *Attorney, Agent, or Firm* — Coats & Bennett, PLLC

(57) ABSTRACT

In a Doherty amplifier, outputs of first (main) and second (peak) transistors are connected by a combined impedance inverter and harmonic termination circuit. The harmonic termination circuit incorporates a predetermined part of the impedance inverter, and provides a harmonic load impedance at a targeted harmonic frequency (e.g., the second harmonic). Control of the amplitude and phase of the harmonic load impedance facilitates shaping of the drain current and voltage waveforms to maximize gain and efficiency, while maintaining a good load modulation at a fundamental frequency. Particularly for Group III nitride semiconductors, such as GaN, both harmonic control and output impedance matching circuits may be eliminated from the outputs of each transistor. The combined impedance inverter and harmonic termination circuit reduces the amplifier circuit footprint, for high integration and low power consumption.

27 Claims, 8 Drawing Sheets

(51) Int. Cl.
*H03F 1/02* (2006.01)
*H03F 1/56* (2006.01)
*H04B 1/04* (2006.01)

(52) U.S. Cl.
CPC .. *H03F 2200/222* (2013.01); *H03F 2200/387* (2013.01); *H03F 2200/453* (2013.01); *H04B 1/04* (2013.01); *H04B 2001/0408* (2013.01)

(58) Field of Classification Search
USPC ......................................................... 330/295
See application file for complete search history.

(56) References Cited

U.S. PATENT DOCUMENTS

| | | | | |
|---|---|---|---|---|
| 7,030,714 | B2* | 4/2006 | Korol | H03F 1/0294 333/124 |
| 2011/0279178 | A1 | 11/2011 | Outaleb et al. | |
| 2015/0097624 | A1* | 4/2015 | Olson | H03F 3/245 330/295 |
| 2015/0145602 | A1* | 5/2015 | Felgentreff | H03F 1/56 330/295 |
| 2016/0049910 | A1 | 2/2016 | Datta et al. | |
| 2019/0173435 | A1* | 6/2019 | McLaren | H03F 3/60 |

OTHER PUBLICATIONS

Cripps, S. et al., "Advanced Techniques in RF Power Amplifier Design", Jan. 1, 2002, Chapter 2, pp. 33-57, Artech House, Inc., US.

Yang, Y., et al., "Fully Matched N-Way Doherty Amplifier With Optimized Linearity", IEEE Transactions on Microwave Theory and Techniques, vol. 51, No. 3, Mar. 1, 2003, pp. 986-993, IEEE.

Goto, S. et al., "Efficiency Enhancement of Doherty Amplifier with Combination of Class-F and Inverse Class-F Schemes for S-Band Base Station Application", 2004 IEEE MTT-S International Microwave Symposium Digest (IEEE Cat. No. 04CH37535), Jun. 6, 2004, pp. 839-842, IEEE.

Kim, J. et al., "Analysis of a Fully Matched Saturated Doherty Amplifier With Excellent Efficiency", IEEE Transactions on Microwave Theory and Techniques, vol. 56, No. 2, Feb. 1, 2008, pp. 328-338, IEEE.

Suzuki, Y. et al., "Highy Efficient Feed-Forward Amplifier using a Class-F Doherty Amplifier", IEEE MTT-S International Microwave Symposium Digest, Jun. 8, 2003, pp. 77-80, IEEE.

Colantonio, P. et al., "Multiharmonic Manipulation for Highly Efficient Microwave Power Amplifiers", Jan. 8, 2001, pp. 1-19, John Wiley & Sons, Inc.

Mohammed, B. et al., "A 2.62-GHz Class-F Power Amplifier with Lumped-Element and Transmission Line Network Design", 2017 Internet Technologies and Applications, Sep. 12, 2017, pp. 275-279, IEEE.

* cited by examiner

DOHERTY AMPLIFIER CIRCUIT WITH INTEGRATED HARMONIC TERMINATION

FIELD OF INVENTION

The present invention relates generally to Radio Frequency amplifier circuits, and in particular to an RF Doherty amplifier configuration with a combined impedance inverter and harmonic termination circuit.

BACKGROUND

Modern wireless communication networks operate by transmitting voice and data content modulated onto Radio Frequency (RF) signals, generally between fixed access points (known as base stations, eNB, gNB, etc.) and a large number of mobile terminals (User Equipment or UE, tablets, laptops, etc.). Signal transmissions in both directions require RF power amplifiers. Efficiency (output power divided by DC power) is an important consideration in both cases. Efficient power amplifiers are desired at access points because inefficient amplifiers simply turn much of the power consumed into heat, raising operating costs and requiring physical designs to release the heat. The power amplifier in a mobile terminal is a major consumer of battery power, and high efficiency is desired to extend the useful device lifetime per charge.

Amplifiers operate most efficiently at or near compression—the point at which an amplifier is always ON, or strongly conducting. An amplifier operating below its compression point operates in a linear range—the output signal is an amplified version of the input signal. Amplifiers that operate partially or totally in compression can transmit frequency/phase modulated signals, or On-Off Keying modulated signals (e.g., Morse code), at high power with high efficiency. In these applications, linearity is not required—that is, the amplifier may distort the signal amplitude without affecting the information modulated onto the signal. However, communication signals that encode information, even in part, by modulating the amplitude of a carrier signal require power amplifiers to operate with high linearity, to preserve the AM information.

Many of the signal modulation schemes standardized for use in modern wireless communication networks, such as for example, the various levels of Quadrature Amplitude Modulation (16-QAM, 64-QAM, 256-QAM), require a linear amplifier to avoid loss of amplitude-modulated information that would occur if the amplifier ran in compression. A characteristic of many such signals is that the average signal power is relatively low, but intermittent peaks in the signal have high power, compared to the average. This characteristic is quantified as the Peak to Average Power Ratio (PAPR). A single power amplifier transmitting a high-PAPR signal exhibits low efficiency, as it must be sized for signal peaks, which occur infrequently, and on average it runs at very low power. That is, the power amplifier must be designed with a large "headroom" that, on average, is not used. Since the operating point of the amplifier is far below its compression point, efficiency is poor. This means much of the power it consumes (from a battery in the case of a mobile terminal) is wasted as heat.

William Doherty solved this problem in 1936, designing a power amplifier having improved efficiency while transmitting high-PAPR AM radio signals. An RF Doherty amplifier 10, represented in block diagram form in FIG. 1, comprises a first transistor 18a used for most signal amplification, often referred to as a "main" or "carrier" amplifier stage, and a second transistor 18b used to amplify signal peaks, often referred to as an "auxiliary" or "peak" amplifier stage. The more general terms "first" and "second" transistor are used herein. A class-AB biased amplifier is often used for the first amplifier stage, which can be biased to amplify the average signal within a linear range, but close to compression (i.e., with low headroom). Signal peaks are amplified by, e.g., a class-C biased amplifier as the second amplifier stage, which is inactive most of the time, and only needs to be linear over a small portion of the input signal conduction angle.

A feature of the Doherty amplifier is the output connection of the first 18a and second 18b transistors, which is made through an impedance inverter 22, often implemented using a quarter-wavelength transmission line, and often having a 90-degree phase shift. At low input signal power levels, the second transistor 18b is inactive, and is effectively an open circuit. The system impedance (e.g., 50Ω) is reduced at the output of the second transistor 18b due to the output matching network 24. This impedance is inverted to a much higher impedance by the impedance inverter 22, presenting a high output impedance to the first transistor 18a, improving its efficiency. As the second transistor 18b begins to amplify signal peaks, its increasing output current (summed with the output current of the first transistor 18a) increases the voltage across the load impedance, which the impedance inverter 22 presents to the first transistor 18a as a decreasing impedance. The lower impedance allows the first transistor 18a output power to increase as the input signal power increases. This is known as load modulation, and it results in the Doherty amplifier 10 exhibiting high efficiency across the full range of input signal power.

Stated differently, load modulation occurs because the output voltage of the Doherty amplifier 10 is determined by the summation of the first 18a second 18b transistor output currents, multiplied by the load impedance. Accordingly, the output impedance of the first transistor 18a is varied by the load current delivered by the second transistor 18b.

Note that, although the impedance inverter 22 often implements a 90-degree phase shift, this is not necessarily a requirement to obtain the load modulation of a Doherty amplifier. For example, a phase lag other than 90 degrees may be introduced in, e.g., the second transistor 18b path, and the impedance inverter 22 introduces a corresponding phase shift, such that the overall phase difference between the two transistor 18a, 18b paths is at or near 90 degrees.

Referring to FIG. 1, a power divider circuit 12 divides an RF input signal between the first 18a and second 18b transistors in response to its instantaneous power level. A phase shifter 14 delays the phase of the second transistor 18b input by matching the delay which the output impedance inverter 22 applies to the output of the first transistor 18a, which is often 90 degrees. In some embodiments, the power divider 12 and phase shifter 14 may be combined in a quadrature power divider, which both splits the input signal and applies a 90-degree phase shift to the second transistor 18b input. Input matching circuits 16a, 16b perform impedance matching, e.g., matching a standard 50Ω system impedance to the low input impedances of the first 18a and second 18b transistors. Similarly, output impedance matching circuits 20a, 20b match the low output impedance of transistors 18a, 18b to a standard system impedance, such as 50Ω.

As described above, the outputs of the first 18a and second 18b transistors in a Doherty configuration 10 are connected by an impedance inverter 22 having a 90-degree phase delay. The impedance inverter 22 is often implemented using a quarter-wavelength transmission line. The output of the Doherty amplifier 10 is taken at a so-called summing node, typically on the second transistor 18b side of the impedance inverter 22. An impedance transformer 24 transforms the load impedance $Z_{load}$ seen by the Doherty amplifier circuit 10 to the standard 50Ω system impedance.

In Doherty amplifier applications, both reducing the system size and increasing battery lifetime demand higher efficiency. High-efficiency power amplifier topologies using harmonic control, such as class-F, inverse class-F, class-J power amplifiers, and so on, are widely deployed. One way to increase the efficiency of a power amplifier is to minimize power dissipated in the device itself. One way to reduce device power dissipation is minimize overlap between voltage and current waveforms of the amplified signal. That is, because dissipated power is the sum of voltage and current, maximum output voltage should ideally occur at low (or zero) current levels, and maximum current should correspond to low voltage. One way to shape the current and voltage waveforms is by controlling the magnitude and phase of harmonic components of the amplified signal. The second harmonic component is usually manipulated to make the appropriate current or voltage waveforms because the second harmonic manipulation is relatively easier than other, higher harmonic components. This approach is described in detail by Paolo Colantonio, et al. in the paper "Multiharmonic Manipulation for Highly Efficient Microwave Power Amplifiers," John Wiley & Sons, 2001, the disclosure of which is incorporated herein by reference in its entirety.

FIG. 2 illustrates a Doherty amplifier topology 11 with harmonic control circuitry 26a, 26b. The harmonic control circuits 26a, 26b are located close to transistors 18a, 18b for effective individual fundamental and harmonic matching. This harmonic-controlled Doherty amplifier 11 can minimize the current and voltage overlap during the load modulation and can achieve better efficiency over the full range of the input signal power than the conventional Doherty amplifier topology 10.

One important development in modern wireless communication networks is the use of spatial diversity and/or spatial multiplexing. Spatial diversity refers to transmitting the same signal on different propagations paths (e.g., different transmit/receive antennas), which increases robustness against fading, co-channel interference, and other deleterious effects of RF signal transmission. Spatial multiplexing also uses multiple transmit and receive antennas, and refers to transmitting different portions of data on different propagation paths, using space-time coding, to increase data rates. These techniques are collectively referred to as Multiple Input, Multiple Output, or "MIMO." The key to all MIMO techniques is the deployment of multiple antennas, on at least one and preferably both sides of the air interface channel. Fourth generation (4G) network standards contemplate 2, 4, or 8 antennas per transceiver; however, fifth generation (5G) networks currently being defined envision up to 128 antennas per transceiver. Each antenna used to transmit an RF signal requires a power amplifier. Hence, compact design and the integration of as many components as possible into the same integrated circuit packages become important design considerations for RF power amplifiers. In addition, efficiency improvement in RF power amplifiers is required because a large number of transceivers are included in one system. Thus, the high-efficiency power amplifier topology using the harmonic control topology is required in designing the Doherty power amplifier.

Unfortunately, the harmonic control circuits 26a, 26b increase the size of each Doherty amplifier 11, thwarting the goals of compact design and high integration.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, outputs of first (main) and second (peak) transistors in a Doherty amplifier configuration are connected by a combined impedance inverter and harmonic termination circuit. The harmonic termination circuit is coupled to the impedance inverter at a predetermined position, it incorporates at least part of the impedance inverter, and it presents a load impedance at a targeted harmonic of the fundamental frequency. Properties of the harmonic load impedance, such as its magnitude and phase, are controlled so as to generate harmonic-controlled voltage and current waveforms of an amplified RF signal. The harmonic termination circuit includes a low impedance path operative to shunt desired amounts of targeted harmonic components (e.g., the second harmonic) to ground. A selected overlap with the impedance inverter provides control of the phase of the harmonic load impedance at a targeted harmonic frequency. The harmonic termination presents a high impedance path to ground at the fundamental signal component at the same node with the low impedance path at the target harmonic frequency, in order to operate a good load modulation in the impedance inverter at the fundamental frequency without any load impedance change. Particularly for Group III nitride semiconductors, such as GaN, both conventional harmonic control and output impedance matching circuits may be eliminated from the outputs of each amplifier.

One embodiment relates to an amplifier operative to amplify an RF signal having a fundamental frequency. The amplifier includes first and second transistors arranged in parallel, and a combined impedance inverter and harmonic termination circuit. The combined impedance inverter and harmonic termination circuit is coupled between outputs of the first and second transistors, and is operative to present a load impedance at a targeted harmonic of the fundamental frequency.

Another embodiment relates to a method of manufacturing an amplifier having a combined impedance inverter and harmonic termination circuit and operative to amplify an RF signal having a fundamental frequency. First and second transistors, arranged in parallel, are provided. An impedance inverter is coupled between outputs of the first and second transistors. A harmonic termination circuit is connected between a portion of the impedance inverter and RF signal ground.

Yet another embodiment relates to an amplifier operative to amplify an RF signal having a fundamental frequency. The amplifier includes first and second transistors arranged in parallel, and a combined impedance inverter and harmonic termination circuit. The combined circuit includes an impedance inverter connecting outputs of the first and second transistors, and a harmonic termination circuit incorporating at least a portion of the impedance inverter. The harmonic termination circuit is operative to present a load impedance at a targeted harmonic of the fundamental frequency.

Still another embodiment relates to an amplifier operative to amplify an RF signal having a fundamental frequency. The amplifier includes first and second transistors arranged in parallel, and a combined impedance inverter and harmonic termination circuit. The combined circuit includes an impedance inverter connecting outputs of the first and second transistors, and a harmonic termination circuit connected between a position on the impedance inverter and RF signal ground.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

An important consideration for power amplifiers in a modern wireless communication network is the ability to amplify RF signals at high frequencies, with high power. For example, 5G networks are anticipated to operate in the GHz bands. A semiconductor technology well suited to meet these requirements is a High Electron Mobility Transistor (HEMT), a type of Field Effect Transistor (FET) having a low noise figure at microwave frequencies. Particularly well suited for use as wireless communication transmitter power amplifiers are HEMTs fabricated from Group III nitride materials. Group III nitrides refer to semiconductor alloys formed between nitrogen and elements in the conventional Group III of the periodic table (group 13 under International Union of Pure and Applied Chemistry, or IUPAC, naming convention)—such as aluminum (Al), Gallium (Ga), and Indium (In). In particular, Gallium Nitride (GaN) HEMTs are well suited for wireless communication power amplifier applications.

A characteristic of GaN HEMTs is a high intrinsic output impedance (e.g., ~20Ω), as compared to other amplifier technologies, such as Laterally Diffused Metal Oxide Semiconductor (LDMOS) (e.g., ~4Ω). This relatively high output impedance allows for innovative circuit configurations at the amplifier 18a, 18b outputs, as described with reference to FIG. 3.

Figure 2:
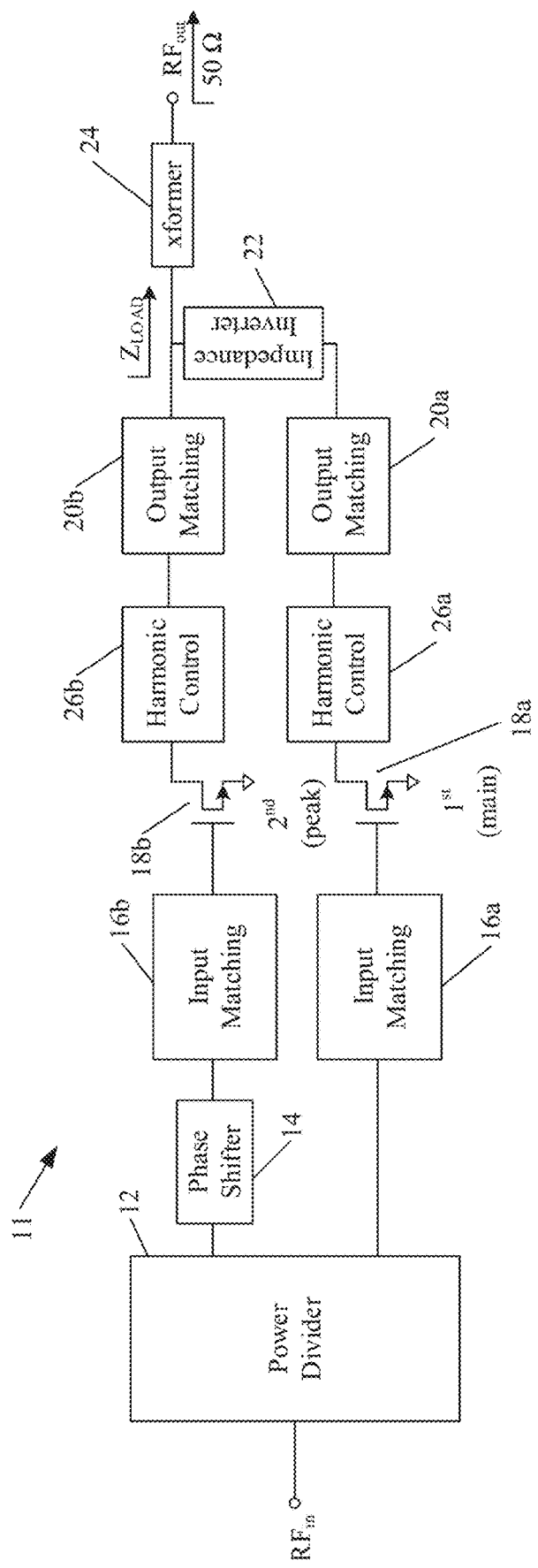
FIG. 2 is a block diagram of a prior art Doherty amplifier including harmonic control.
Figure 3:
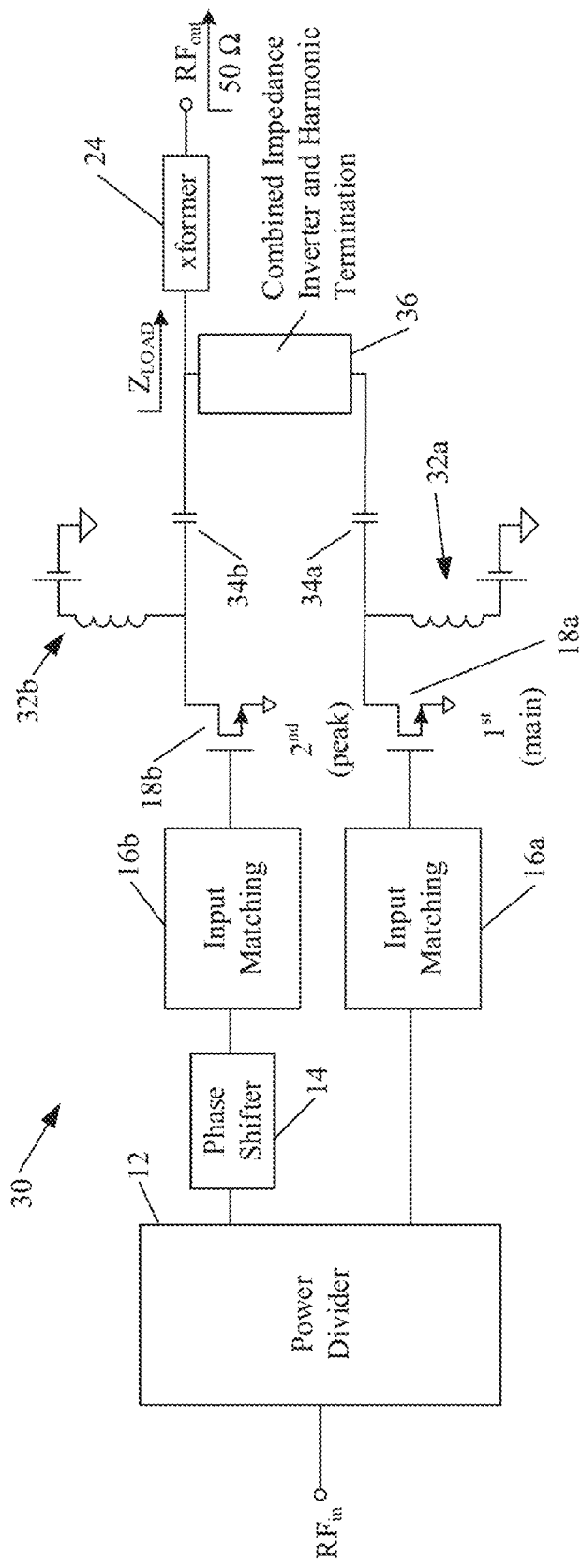
FIG. 3 is a block diagram of a Doherty amplifier having a combined impedance inverter and harmonic termination circuit.

FIG. 3 depicts a block diagram of a Doherty amplifier circuit 30, according to one embodiment, having a combined impedance inverter and harmonic termination circuit. The Doherty amplifier 30 includes a power divider 12, a phase shifter 14, input impedance matching circuits 16a, 16b, and a first (main) transistor 18a and second (peak) transistor 18b, all as described above with reference to FIGS. 1 and 2. In the embodiment of FIG. 3, the output impedance matching circuits 20a, 20b are minimized by use of Radio Frequency Chokes (RFC) 32a, 32b. The RFCs 32a, 32b each comprise an inductor and capacitor connected in series between the respective amplifier 18a, 18b output and RF signal ground. The inductors and capacitors in the RFCs 32a, 32b are sized to resonate out the imaginary part of the complex amplifier 18a, 18b output impedance. The use of RFCs 32a, 32b, and the relatively high output impedance of GaN transistors 18a, 18b, yield relatively high, real, output impedance. This obviates the need for extensive output impedance matching circuits 20a, 20b (FIGS. 1, 2), allowing the combined impedance inverter and harmonic termination circuit 36 to electrically directly connect (at operating frequencies) to the transistor 18a, 18b outputs.

DC blocking capacitors 34a, 34b in series with the transistor 18a, 18b outputs, present a low impedance (i.e., substantially a short circuit) to the transistor 18a, 18b output signals at operating frequencies. The DC blocking capacitors 34a, 34b present several advantages. First, the DC blocking capacitor 34a assists the Doherty amplifier 30 load modulation function. Second, the DC blocking capacitor 34b assists to present a large impedance to the second transistor 18b at the summing node. Those of skill in the art will recognize that the DC blocking capacitors 34a, 34b may be located in different positions than those shown in FIG. 3—for example, incorporated into the impedance inverter 38.

According to embodiments of the present invention, a combined impedance inverter and harmonic termination circuit 36 connects the outputs of the first 18a and second 18b transistors. This circuit 36 includes both an impedance inverter 38 and a harmonic termination circuit 40. See FIGS. 4 and 5 for embodiments of these circuits. Combining the harmonic termination circuit with the impedance inverter dramatically lowers component count, and facilitates tight integration of multiple Doherty amplifiers 30 in a small package.

Figure 1:
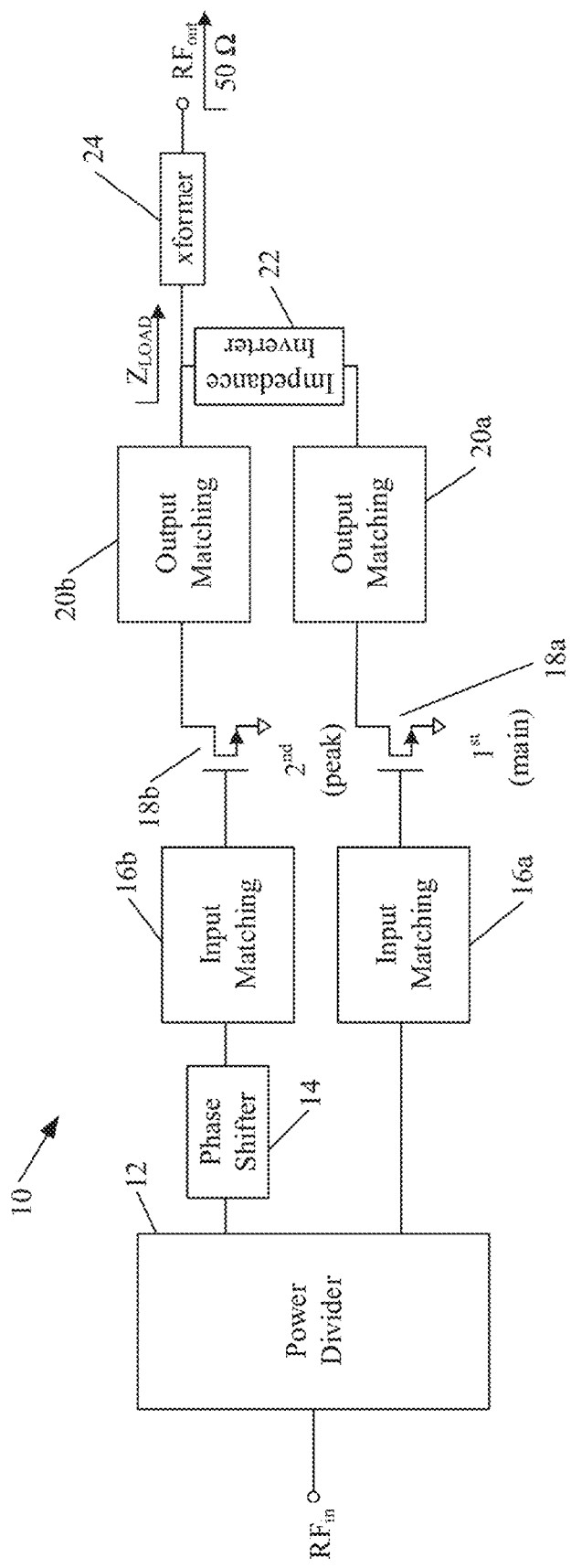
FIG. 1 is a block diagram of a prior art Doherty amplifier.

Within the combined impedance inverter and harmonic termination circuit 36, the impedance inverter 38 is substantially similar to the impedance inverter 22 of FIGS. 1 and 2. As well known in Doherty amplifiers, the impedance inverter provides load modulation at a fundamental frequency of the amplified RF signal, and may be implemented, for example, as a quarter-wave transmission line. The harmonic termination circuit 40 presents a load impedance at a targeted harmonic of the fundamental frequency, such as for example the second harmonic. Characteristics of the targeted harmonic load impedance, such as its magnitude and phase, are determined by parameters of the harmonic termination circuit 40, and hence may be controlled by designers.

Figure 4:
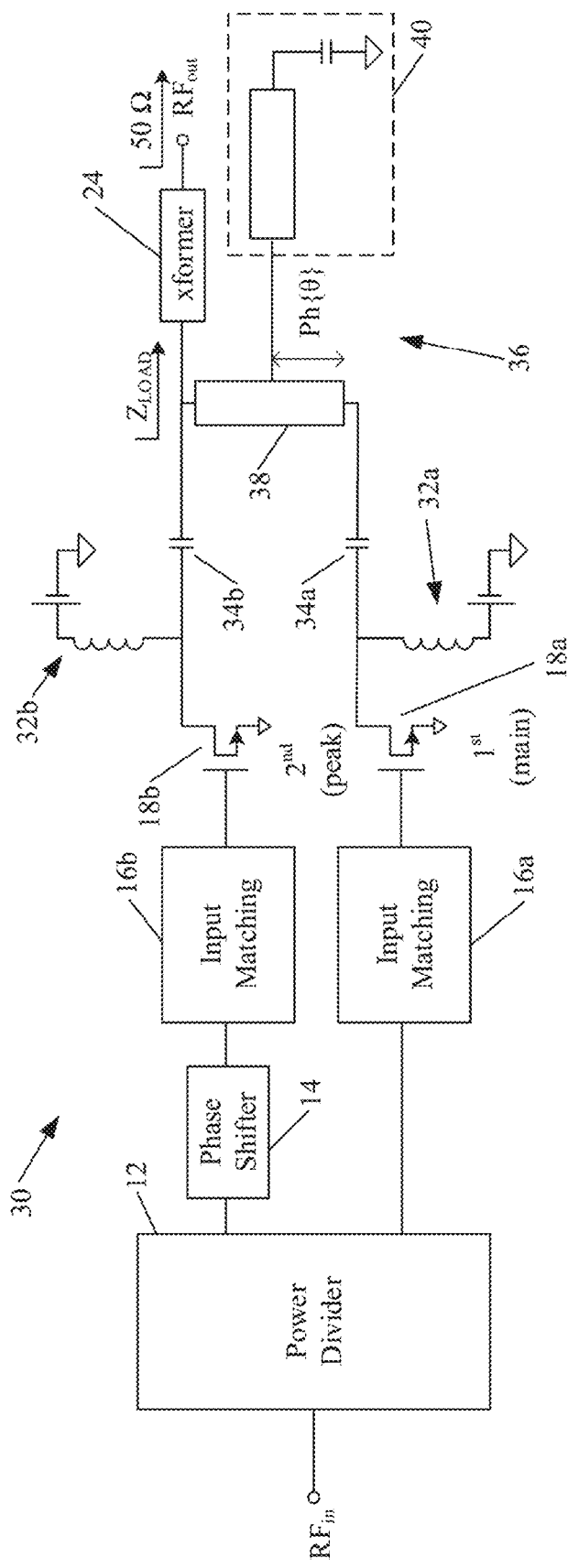
FIG. 4 is a block diagram of a Doherty amplifier showing one implementation of an impedance inverter and harmonic termination circuit.
Figure 5:
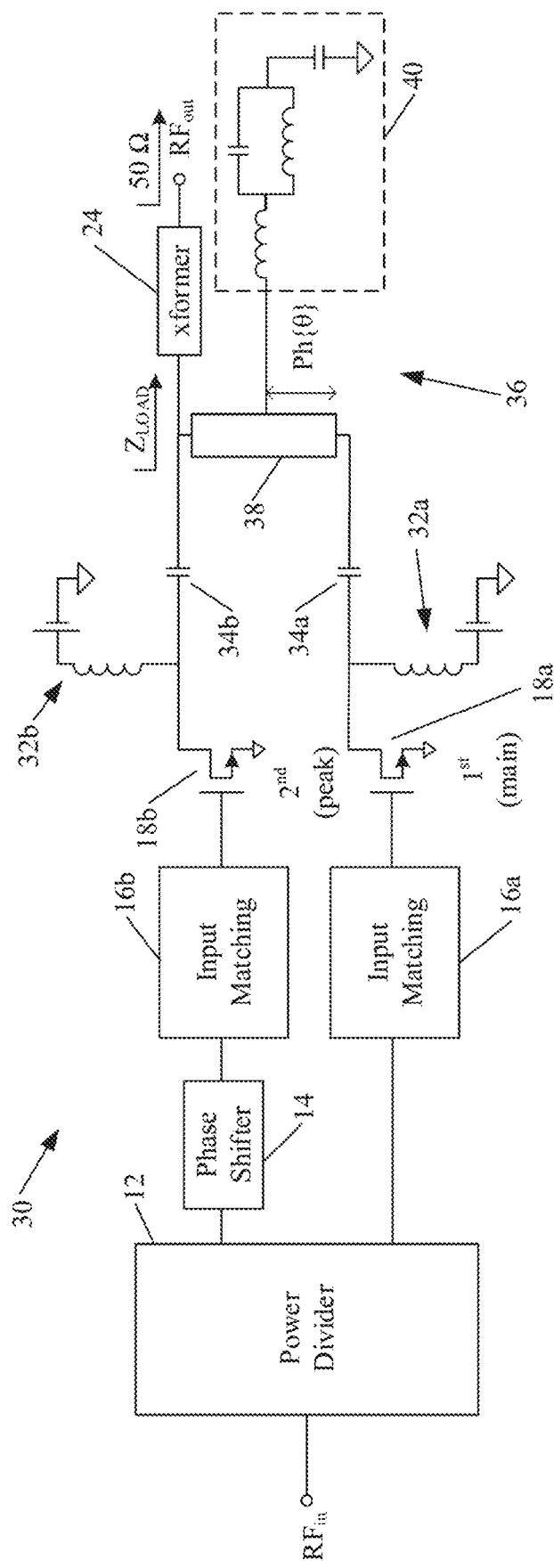
FIG. 5 is a block diagram of a Doherty amplifier showing another implementation of an impedance inverter and harmonic termination circuit.

In particular, the magnitude of the targeted harmonic load impedance is controlled by shunting some (up to substantially all) of the targeted harmonic component to RF signal ground, as describe in greater detail herein with reference to FIGS. 4 and 5. The harmonic termination circuit 40 accomplishes this by providing a low impedance path to RF signal ground at the targeted harmonic frequency. Simultaneously, the harmonic termination circuit 40 presents a high impedance path to ground (i.e., substantially an open circuit) at the fundamental frequency. Hence, the harmonic termination circuit 40 does not substantially interfere with the load modulation function of the impedance inverter 38 at the fundamental frequency.

The phase of the targeted harmonic load impedance is controlled by incorporating some portion of the impedance inverter 38 into the harmonic termination circuit 40. As shown in FIGS. 4 and 5, the position along the impedance inverter 38 at which the harmonic termination circuit 40 is connected, determines the phase. By altering this connection point, designers can control the phase of the targeted harmonic load impedance, allowing for waveform engineering, as described in greater detail herein with reference to FIGS. 6(a) and 6(b). Stated differently, the harmonic termination circuit 40 incorporates a selectable portion of the impedance inverter 38, with that portion determined by its connection point along the length of the impedance inverter 38.

In one embodiment (not depicted in the figures), two or more harmonic termination circuits 40 may be placed as different positions along the impedance inverter 38, each having a series transistor switch operative to disconnect it from the impedance inverter 38. By closing only a selected one of these switches, one of a plurality of preselected harmonic load impedance phase values may be dynamically selected during operation. One embodiment, the harmonic termination circuits 40 may include different components values, yielding different degrees of attenuation of the targeted harmonic component of the amplified RF signal.

Similarly, in another embodiment (not depicted in the figures), two or more independently enabled harmonic termination circuits 40 may comprise component values that target different harmonic components of the amplified RF signal, such as the third or higher-order harmonics. In other embodiments, one or more harmonic termination circuit 40 may include adjustable components, such as an adjustable capacitor, allowing for tuning of the harmonic termination circuit after its manufacture. Indeed, harmonic termination circuits 40 for both aspects (multiple phases and/or degrees of attenuation for a given harmonic load impedance, and targeting multiple harmonic components) may be implemented in some embodiments. Those of skill in the art may readily implement such options, given the teachings of the present disclosure.

FIG. 4 depicts one embodiment of the Doherty amplifier 30 of FIG. 3. The impedance inverter 38—which may, for example, comprise a quarter-wave transmission line—connects the outputs of the first 18a and second 18b transistors, providing the load modulation that is characteristic of Doherty amplifiers. The harmonic termination circuit 40 comprises a predetermined portion of the impedance inverter 38, another transmission line, and a decoupling capacitor shunted to RF signal ground. The parameters of the transmission line and capacitor are selected such that, at the frequency of operation, the path through the harmonic termination circuit 40 to ground has a high impedance at the fundamental frequency (i.e., it appears as substantially an open circuit), but has a low impedance at the second (or other) harmonic frequency (up to appearing as a short circuit). Note that the harmonic termination circuit 40 may be connected to the impedance inverter 38 at any point along its length. By adjusting this degree of overlap, the phase of a targeted (e.g., second) harmonic load impedance presented by the harmonic termination circuit may be engineered. The ability to control the phase of the harmonic load impedance is important to shaping harmonic-controlled voltage and current waveforms, as described further herein.

FIG. 5 depicts another embodiment of the Doherty amplifier 30 of FIG. 3. In this embodiment, the harmonic termination circuit 40 also overlaps the impedance inverter 38 by a predetermined amount, which determines the phase of the targeted (e.g., second) harmonic load impedance. However, rather than a transmission line, the harmonic termination circuit 40 in this case comprises an inductor in series with an LC parallel resonator (also known as an LC tank circuit), in series with the decoupling capacitor connected to RF signal ground. The inductor and capacitor component values are selected so as to provide, at the frequency of operation, substantially an open circuit at the fundamental frequency and a low impedance (up to substantially a short circuit) at the, e.g., second harmonic frequency.

Figure 6A:
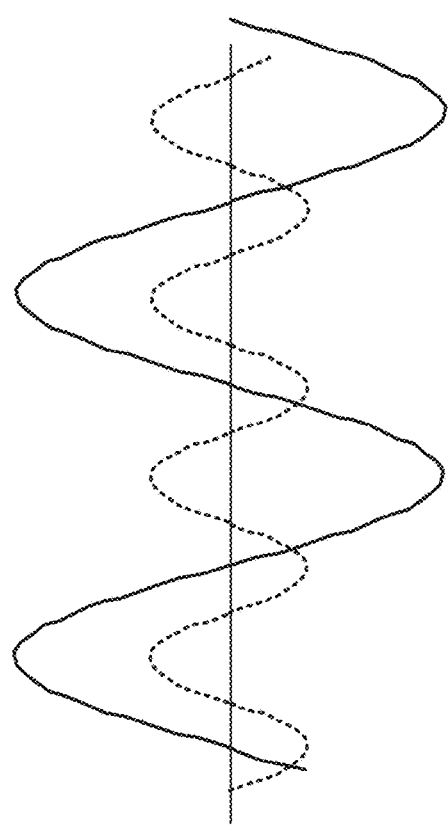
FIG. 6(a) is a graph of the fundamental and second harmonic components of a sine wave.
Figure 6B:
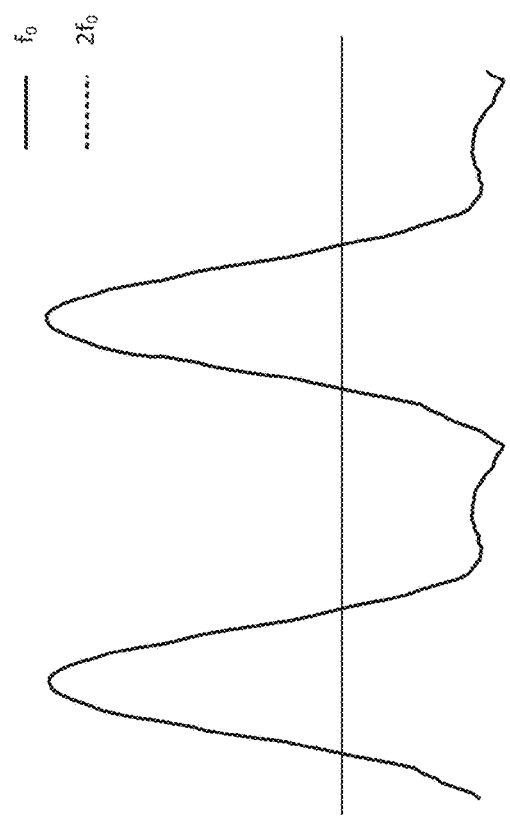
FIG. 6(b) is a graph of a waveform resulting from the interference between the fundamental and second harmonic components of FIG. 6(a).

FIGS. 6a and 6b illustrate the principle of waveform engineering by controlling harmonic components. FIG. 6a depicts the fundamental and second harmonic components of, e.g., the voltage waveform of an amplified signal—in this case, a sine wave. In general, if these curves are not aligned, constructive and destructive interference will occur haphazardously, introducing unwanted distortion on the fundamental frequency waveform. Accordingly, much engineering effort is typically expended in attempting to suppress harmonic components altogether. However, as FIGS. 6a and 6b demonstrate, proper control of the harmonics can improve desired characteristics of the waveform.

Because the fundamental and second harmonic components are aligned in FIG. 6a, the curves add to increase the magnitude of positive signal peaks of the fundamental frequency waveform. Additionally, the curves subtract where the second harmonic component goes negative, which narrows the width of the fundamental frequency positive half-cycles. Note that the positive half-cycles of the second harmonic component that coincide with the negative peaks of the fundamental frequency component clip the negative peaks, yielding a half-sinusoidal signal. By increasing the voltage peaks, the maximum gain is improved (so long as the power capability of the transistor is not exceeded).

Additionally, by "narrowing" the waveforms, separation between the current and voltage waveforms is facilitated, resulting in less power dissipated in the device and hence greater efficiency.

Figure 7B:
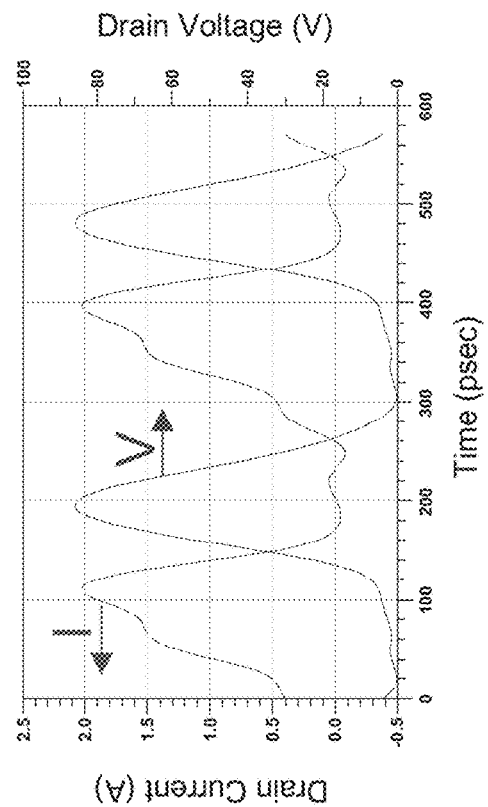
FIG. 7(b) is graph of amplifier output signal voltage and current waveforms with second harmonic control.
Figure 7A:
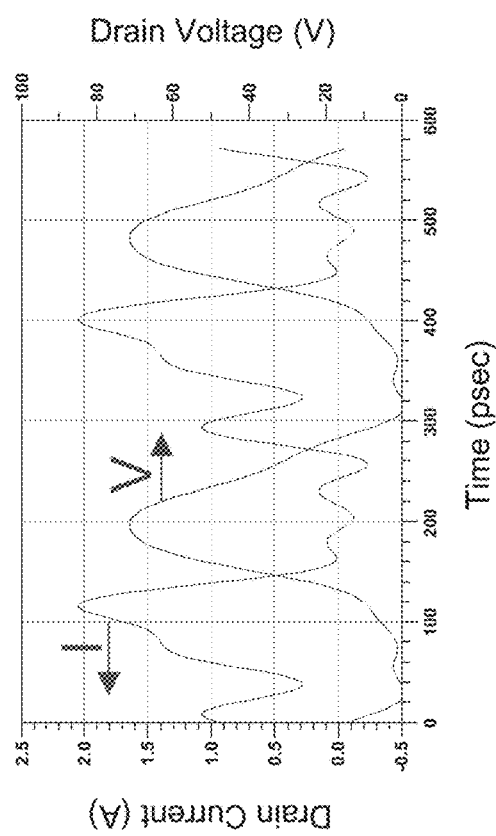
FIG. 7(a) is graph of amplifier output signal voltage and current waveforms without harmonic control.

FIGS. 7(a) and 7(b) demonstrate that the combined impedance inverter and harmonic termination circuit 36, such as those depicted in FIGS. 3-5, is effective in controlling the amplitude and phase of second harmonic components of an amplified signal, yielding harmonic-controlled waveforms. FIG. 7(a) is a plot of voltage and current waveforms for an exemplary amplified RF signal (e.g., sine wave), as simulated using a conventional Doherty amplifier configuration 10 (e.g., FIG. 1). FIG. 7(b) is a plot of waveforms for the same signal amplified using the inventive Doherty amplifier embodiment 30 of FIG. 4, with component values selected to control the magnitude of the second harmonic load impedance presented, and a connection to the impedance inverter selected to control its phase. In both cases, the amplifiers were run around P4 dB power level in the first (main) transistor 18a. As shown in the graphs, the second harmonic component control improves both voltage and current waveforms, as well as their separation. In particular, extraneous lobes and ringing are suppressed in the current waveform, and the voltage waveform exhibits less spread and has higher peaks. Specific values are presented in Table 1 below, showing that the combined impedance inverter and harmonic termination circuit 36 achieves a higher fundamental component and drain efficiency.

TABLE 1

Simulated amplitude of the voltage, current, and drain efficiency around P4dB

|  | Conventional Doherty Amplifier | Doherty Amplifier with Combined Impedance Inverter and Harmonic Termination |
|---|---|---|
| Amplitude of Fundamental Voltage (V) | 33.9 | 37.8 |
| Amplitude of Fundamental Current (A) | 0.8 | 0.95 |
| Drain Efficiency (%) | 55.0 | 62.8 |

Additionally, the two Doherty amplifier configurations were simulated at the 8 dB back-off power level from the P4 dB. These data are depicted in Table 2.

TABLE 2

Simulated drain efficiency and power gain at 8 dB backoff

|  | Conventional Doherty Amplifier | Doherty Amplifier with Combined Impedance Inverter and Harmonic Termination |
|---|---|---|
| Drain Efficiency (%) | 54.0 | 56.5 |
| Power Gain (dB) | 12.4 | 13.1 |

These simulation results have validated that embodiments of the present invention achieve higher power gain and efficiency through the harmonic termination, with the compact form factor facilitating high integration.

Doherty amplifiers 30 having a combined impedance inverter and harmonic termination circuit 36 according to embodiments of the present invention may be packaged in a variety of ways. One or more such amplifiers may be fabricated on an integrated circuit, using known techniques and technologies. Additionally or alternatively, multiple prefabricated Doherty amplifier circuits may be combined onto a Power Amplifier Module (PAM), Multi-Chip Module (MCM), Printed Circuit Board (PCB), or other substrate, as known in the art. At any level of integration, the Doherty amplifier configurations 30 according to embodiments of the present invention provide superior performance, by controlling harmonic components of amplified RF signals while outputting the fundamental signal components, and doing so in a small form factor and hence providing for high levels of integration. For example, numerous such Doherty amplifiers 30 may be combined and deployed in wireless communication network equipment. As non-limiting examples, such equipment may include the final stage of a 4G small-cell base station, the driver stage of a 4G macro base station, and/or the final stage of 5G new radio (NR) or massive multiple-input and multiple-output (MIMO) systems. Embodiments of the invention may similarly be advantageously deployed in User Equipment (UE), such as "smartphones," cellular-equipped tablet and laptop computers, and the like.

Figure 8:
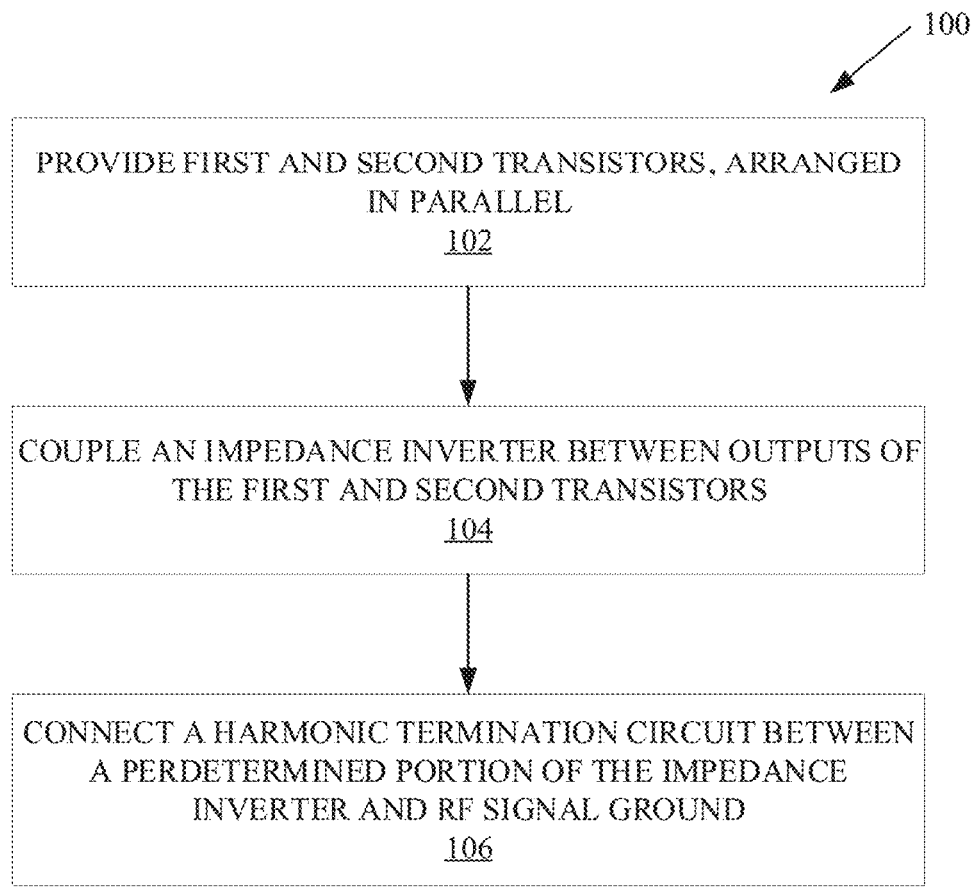
FIG. 8 is a flow diagram of a method of manufacturing an amplifier.

FIG. 8 depicts the steps in a method 100 of manufacturing an amplifier 30 having a combined impedance inverter and harmonic termination circuit 36 and operative to amplify an RF signal having a fundamental frequency. The amplifier 30 may be manufactured on a substrate, which may comprise a substrate of an integrated circuit die, a substrate of a multi-chip module, a printed circuit board, or the like. First 18a and second 18b transistors are provided, arranged in parallel (block 102). An impedance inverter 38 is coupled between outputs of the first 18a and second 18b transistors (block 104). A harmonic termination circuit 40 is connected between a variable portion of the impedance inverter 38 and RF signal ground. A connection of the harmonic termination circuit 40 to the impedance inverter 38 is adjusted so as to control a phase of a load impedance presented by the harmonic termination circuit 40 at a targeted harmonic of the fundamental frequency. The targeted harmonic may be, for example, the second harmonic.

Embodiments of the present invention present numerous advantages over Doherty amplifiers known in the prior art. Although the advantages of controlling harmonic components of RF signals is known, prior art harmonic control circuits are bulky and consume power. Furthermore, they require output impedance matching. Particularly for Group III Nitride material power amplifiers having relatively high intrinsic output impedance, according to embodiments of the present invention both the output impedance matching and conventional harmonic control circuits are eliminated. The combination of RF choke circuits and DC blocking capacitors on the outputs of the amplifiers, and the use of a combined impedance inverter and harmonic termination circuit, achieve harmonic control with reduced component count and small circuit footprint, facilitating high integration and lowering overall power consumption.

The term "directly electrically connected" or "electrically connected" or simply "connected" describes a permanent low-ohmic connection between electrically connected elements, for example a wire connection between the concerned elements. Although such a connection may have parasitic effects, such as the parasitic inductance of a bond wire, no component or element is interposed between the connected elements. By contrast, the term "electrically coupled" or simply "coupled" means that one or more intervening element(s) or components, configured to influence the electrical signal in some tangible way, may be (but is not necessarily) provided between the electrically coupled elements. These intervening elements may include active elements, such as transistors or switches, as well as passive elements, such as inductors, capacitors, diodes, resistors, etc.

Spatially relative terms such as "under," "below," "lower," "over," "upper" and the like, are used for ease of description to explain the positioning of one element relative to another element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an", and "the" are intended to include the plural as well as the singular, unless the context clearly indicates otherwise.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A Doherty amplifier operative to amplify an RF signal having a fundamental frequency, comprising:
   main and peak transistors arranged in parallel; and
   a combined impedance inverter and harmonic termination circuit coupled between outputs of the main and peak transistors, and operative to present a a low impedance path to RF signal ground at a targeted harmonic of the fundamental frequency, without substantially interfering with the load modulation function of the impedance inverter at the fundamental frequency.

2. The amplifier of claim 1 wherein the harmonic termination circuit presents a targeted harmonic load impedance, and wherein the phase of the targeted harmonic load impedance depends on a position along the impedance inverter at which the harmonic termination circuit is connected.

3. The amplifier of claim 1 wherein the harmonic termination circuit presents a high impedance path to RF signal ground at the fundamental frequency.

4. The amplifier of claim 1 wherein the harmonic termination circuit comprises a portion of the impedance inverter in series with a decoupling capacitor connected to RF signal ground.

5. The amplifier of claim 4 wherein the harmonic termination circuit further comprises a transmission line interposed between the impedance inverter and the decoupling capacitor.

6. The amplifier of claim 4 wherein the harmonic termination circuit further comprises a series connection of an inductor and an LC resonance circuit interposed between the impedance inverter and the decoupling capacitor.

7. The amplifier of claim 6 wherein the LC resonance circuit comprises a capacitor and inductor connected in parallel.

8. The amplifier of claim 1 further comprising a DC blocking capacitor interposed between each amplifier output and the combined impedance inverter and harmonic termination circuit.

9. The amplifier of claim 8 further comprising an RF choke circuit connected between the output of each amplifier and RF signal ground.

10. The amplifier of claim 9 wherein each RF choke circuit comprises an inductor and a capacitor connected in series.

11. The amplifier of claim 2 wherein the magnitude and phase of the targeted harmonic load impedance control drain current and voltage waveforms of the amplified RF signal.

12. A method of manufacturing a Doherty amplifier having a combined impedance inverter and harmonic termination circuit and operative to amplify an RF signal having a fundamental frequency, comprising:
   providing main and peak transistors arranged in parallel;
   coupling an impedance inverter between outputs of the first and second transistors;
   connecting a harmonic termination circuit between a portion of the impedance inverter and RF signal ground, wherein the harmonic termination circuit is configured to present a load impedance at a targeted harmonic of the fundamental frequency, without substantially interfering with the load modulation function of the impedance inverter at the fundamental frequency.

13. The method of claim 12 wherein the portion of the impedance inverter incorporated into the harmonic termination circuit controls a phase of a load impedance presented by the harmonic termination circuit at a targeted harmonic of the fundamental frequency.

14. The method of claim 12 wherein the harmonic termination circuit presents a low impedance path to RF signals at the targeted harmonic of the fundamental frequency.

15. The method of claim 12 wherein the harmonic termination circuit presents a high impedance path to RF signal ground at the fundamental frequency.

16. The method of claim 13 wherein the harmonic termination circuit comprises a portion of the impedance inverter in series with a decoupling capacitor connected to RF signal ground.

17. The method of claim 16 wherein the harmonic termination circuit further comprises a transmission line interposed between the impedance inverter and the decoupling capacitor.

18. The method of claim 16 wherein the harmonic termination circuit further comprises a series connection of an inductor and an LC resonance circuit interposed between the impedance inverter and the decoupling capacitor.

19. The method of claim 18 wherein the LC resonance circuit comprises a capacitor and inductor connected in parallel.

20. The method of claim 12 further comprising interposing a DC blocking capacitor between each amplifier output and the combined impedance inverter and harmonic termination circuit.

21. The method of claim 20 further comprising connecting an RF choke circuit between the output of each amplifier and RF signal ground.

22. The method of claim 21 wherein each RF choke circuit comprises an inductor and a capacitor connected in series.

23. The method of claim 12 further comprising controlling drain current and voltage waveforms of the amplified RF signal by selecting the predetermined portion the impedance inverter incorporated into the harmonic termination circuit.

24. The method of claim 23 wherein controlling drain current and voltage waveforms of the amplified RF signal comprises increasing separation between the current and voltage waveforms in the time domain.

25. The method of claim 23 wherein controlling drain current and voltage waveforms of the amplified RF signal comprises increasing a peak of the voltage waveform.

26. A Doherty amplifier operative to amplify an RF signal having a fundamental frequency, comprising:
- main and peak transistors arranged in parallel; and
- a combined impedance inverter and harmonic termination circuit, comprising an impedance inverter connecting outputs of the first and second transistors; and
  - a harmonic termination circuit incorporating at least a portion of the impedance inverter, and operative to present a low impedance path to RF signal ground at a targeted harmonic of the fundamental frequency, without substantially interfering with the load modulation function of the impedance inverter at the fundamental frequency.

27. A Doherty amplifier operative to amplify an RF signal having a fundamental frequency, comprising:
- main and peak transistors arranged in parallel;
- a combined impedance inverter and harmonic termination circuit, comprising an impedance inverter connecting outputs of the first and second transistors; and
  - a harmonic termination circuit connected between a position on the impedance inverter and RF signal ground, and operative to present a load impedance at a targeted harmonic of the fundamental frequency, without substantially interfering with the load modulation function of the impedance inverter at the fundamental frequency.

* * * * *